US009735790B2

United States Patent
Sai et al.

(10) Patent No.: US 9,735,790 B2
(45) Date of Patent: Aug. 15, 2017

(54) RADIO COMMUNICATION DEVICE AND RADIO COMMUNICATION METHOD

(71) Applicant: KABUSHIKI KAISHA TOSHIBA, Minato-ku (JP)

(72) Inventors: Akihide Sai, Kawasaki (JP); Hidenori Okuni, Yokohama (JP); Masanori Furuta, Odawara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/438,030

(22) Filed: Feb. 21, 2017

(65) Prior Publication Data

US 2017/0170837 A1 Jun. 15, 2017

Related U.S. Application Data

(63) Continuation of application No. PCT/JP2015/072859, filed on Aug. 12, 2015.

(30) Foreign Application Priority Data

Aug. 22, 2014 (JP) .................................. 2014-169763

(51) Int. Cl.
*H03L 7/08* (2006.01)
*H03L 7/113* (2006.01)
(Continued)

(52) U.S. Cl.
CPC ................ *H03L 7/113* (2013.01); *H03F 3/19* (2013.01); *H04L 27/152* (2013.01);
(Continued)

(58) Field of Classification Search
CPC ... H03L 2207/06; H03L 2207/50; H03L 7/06; H03L 7/08; H04L 27/227; H04L 7/0037; H04L 7/0331; H04L 7/0332; H04L 27/152
(Continued)

(56) References Cited

U.S. PATENT DOCUMENTS 5,363,112 A * 11/1994 Hatcher ................. H03L 7/093
 331/17
5,363,419 A * 11/1994 Ho ............................ H03L 7/10
 331/1 A
(Continued)

FOREIGN PATENT DOCUMENTS

JP 2877198 3/1999
JP 2004-312726 11/2004
(Continued)

OTHER PUBLICATIONS

International Search Report issued Oct. 6, 2015 in PCT/JP2015/072849 filed on Aug. 12, 2015.

*Primary Examiner* — Emmanuel Bayard
(74) *Attorney, Agent, or Firm* — Oblon, McClelland, Maier & Neustadt, L.L.P.

(57) ABSTRACT

A radio communication device has an analog control loop unit to generate an analog control signal that adjusts a phase of a voltage control oscillation signal, a digital control loop unit to generate a digital control signal having a frequency determined by a frequency of a reference signal and a predetermined frequency setting code signal and a phase opposite to a phase of the analog control signal, a voltage controlled oscillator to generate the voltage control oscillation signal, a data slicer to generate a digital signal including the reception signal, an automatic offset controller to generate a correction signal in response to an error between a frequency of the reception signal and a frequency of the
(Continued)

voltage control oscillation signal, and a setting code adjuster to adjust the frequency setting code signal, wherein gain of the digital control loop unit is higher than gain of the analog control loop unit.

19 Claims, 11 Drawing Sheets

(51) Int. Cl.
*H03F 3/19* (2006.01)
*H04L 27/152* (2006.01)

(52) U.S. Cl.
CPC .. *H03F 2200/294* (2013.01); *H03F 2200/375* (2013.01); *H03F 2200/451* (2013.01)

(58) Field of Classification Search
USPC .................. 375/327, 340, 371–376
See application file for complete search history.

(56) References Cited

U.S. PATENT DOCUMENTS

| | | | | |
|---|---|---|---|---|
| 5,724,105 A * | 3/1998 | Hatano | ............... | H04N 5/50 348/725 |
| 5,883,930 A | 3/1999 | Fukushi | | |
| 6,028,460 A * | 2/2000 | McCollum | ............... | H03L 7/095 327/105 |
| 6,104,682 A * | 8/2000 | Konishi | ............. | G11B 7/08505 369/124.01 |
| 6,281,946 B1 * | 8/2001 | Hisada | ............... | H03J 7/04 348/607 |
| 7,015,763 B1 * | 3/2006 | Hallivuori | ............... | H03L 7/087 331/11 |
| 7,541,848 B1 * | 6/2009 | Masuda | ............... | H03K 19/018528 327/147 |
| 9,172,570 B1 * | 10/2015 | Li Puma | ............... | H04L 27/04 |
| 2004/0090276 A1 * | 5/2004 | Kiyose | ............... | H03L 7/087 331/57 |
| 2004/0155685 A1 * | 8/2004 | Tatem, Jr. | ............... | A61B 17/320016 327/156 |
| 2004/0223575 A1 | 11/2004 | Meltzer et al. | | |
| 2006/0034395 A1 * | 2/2006 | Evans | ............... | H03L 7/07 375/326 |
| 2006/0214737 A1 * | 9/2006 | Brown | ............... | H03L 7/0893 331/16 |
| 2007/0054629 A1 * | 3/2007 | Maligeorgos | ............... | H04L 27/0002 455/88 |
| 2009/0086856 A1 | 4/2009 | Seki et al. | | |
| 2009/0207961 A1 * | 8/2009 | Sai | ............... | H03L 7/087 375/375 |
| 2014/0218124 A1 * | 8/2014 | Tang | ............... | H03C 3/0925 331/36 C |
| 2016/0173303 A1 | 6/2016 | Sai et al. | | |

FOREIGN PATENT DOCUMENTS

| | | |
|---|---|---|
| JP | 2009-81813 | 4/2009 |
| JP | 2009-194611 | 8/2009 |
| JP | 2010-251821 | 11/2010 |
| WO | WO 2015/025965 A1 | 2/2015 |

* cited by examiner

RADIO COMMUNICATION DEVICE AND RADIO COMMUNICATION METHOD

CROSS REFERENCE TO RELATED APPLICATIONS

This application is based upon and claims the benefit of priority from the prior Japanese Patent Application No. 2014-169763, filed on Aug. 22, 2014, the entire contents of which are incorporated herein by reference.

FIELD

Embodiments of the present disclosure relate to a radio communication device and a radio communication method.

BACKGROUND

There has been proposed a receiver including a digital PLL circuit that automatically corrects offsets of a phase and a frequency between a transmitter and a receiver, based on offset amounts of the phase and the frequency between the transmitter and the receiver, the offset amounts being detected by an angle arithmetic circuit after an RF reception signal including FSK data is frequency-converted and then is A/D converted.

This type of conventional receiver detects the offset amounts of the phase and the frequency by mutually using an in-phase signal and a quadrature signal so that a circuit scale increases. A circuit scale of the digital PLL circuit including, for example, the angle arithmetic circuit is also large so that reduction of power consumption is difficult to achieve.

DETAILED DESCRIPTION

According to one embodiment, a radio communication device comprising:

an analog control loop unit to generate an analog control signal that adjusts a phase of a voltage control oscillation signal, in synchronization with a phase of a reception signal;

a digital control loop unit to generate a digital control signal having a frequency determined by a frequency of a reference signal and a predetermined frequency setting code signal and a phase opposite to a phase of the analog control signal;

a voltage controlled oscillator to generate the voltage control oscillation signal, based on the analog control signal and the digital control signal;

a data slicer to generate a digital signal including the reception signal digitally demodulated, based on a comparison between the digital control signal and a threshold value;

an automatic offset controller to generate a correction signal in response to an error between a frequency of the reception signal and a frequency of the voltage control oscillation signal, based on a time difference between timing with which the digital control signal is equivalent to the threshold value and previously determined reference timing; and a setting code adjuster to adjust the frequency setting code signal based on the correction signal, wherein gain of the digital control loop unit is higher than gain of the analog control loop unit.

Embodiments of the present disclosure will be described below with reference to the drawings. A distinguishing configuration and operation thereof in a receiver to be provided in a radio communication device, will be mainly described in each of the following embodiments, but the receiver may include an omitted configuration and operation thereof in the following descriptions. Note that, the scope of the present embodiments includes the omitted configuration and the operation. The radio communication device according to each of the following embodiments may include only the receiver, or may include a configuration, such as a transmitter, other than the receiver. The radio communication device may be a stationary communication device or a portable radio terminal.

First Embodiment

Figure 1:
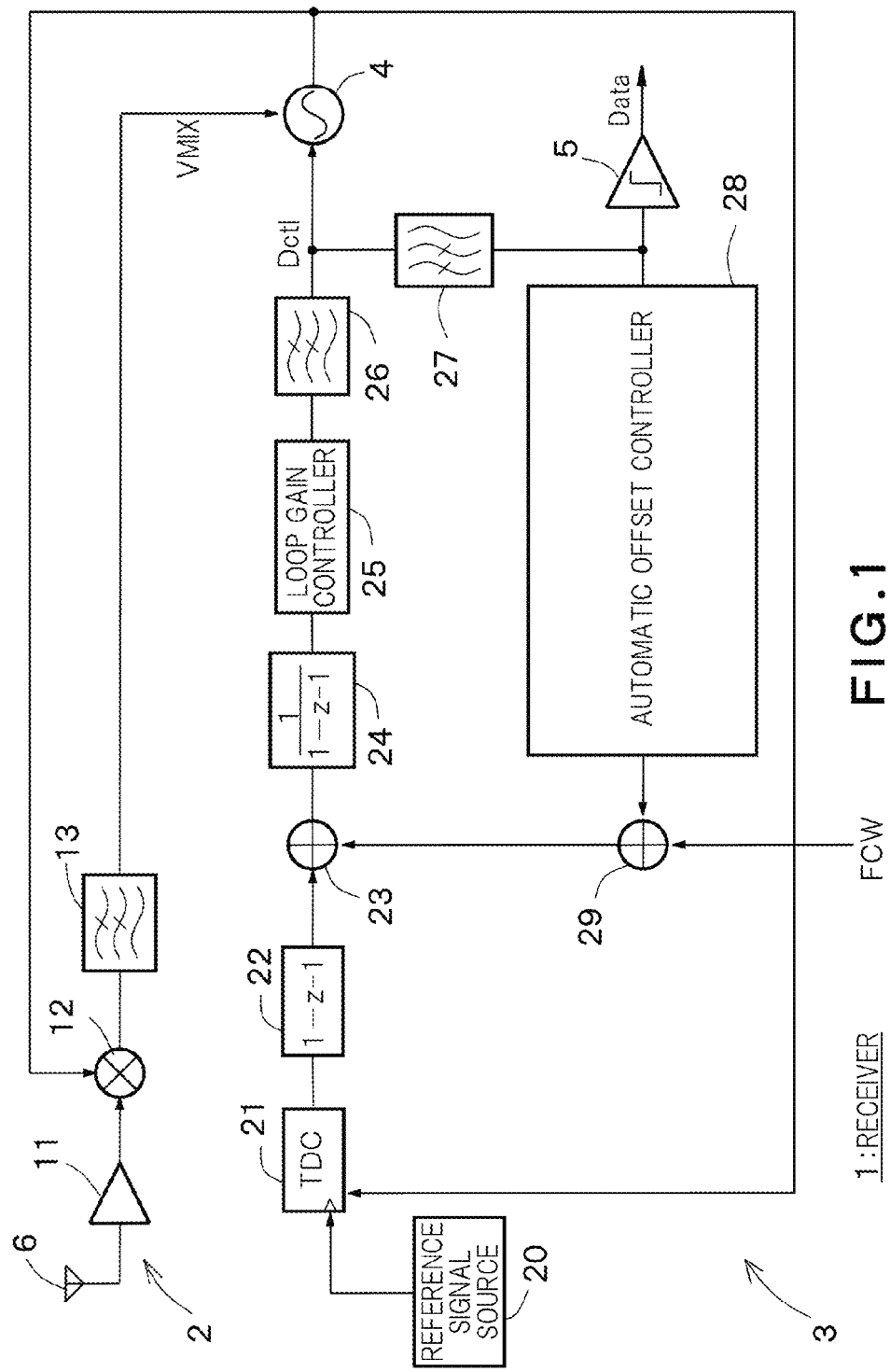
FIG. 1 is a block diagram of a schematic configuration of a receiver according to a first embodiment.

FIG. 1 is a block diagram of a schematic configuration of a receiver 1 in a radio communication device according to a first embodiment. The receiver 1 in FIG. 1 includes an analog control loop unit 2, a digital control loop unit 3, a voltage controlled oscillator 4, and a data slicer 5. The receiver 1 in FIG. 1 is used, for example, when a PSK signal is received.

The analog control loop unit 2 generates an analog control signal $V_{MIX}$ for adjusting a phase of a voltage control oscillation signal, in synchronization with a phase of a reception signal received by an antenna 6.

The digital control loop unit 3 generates a digital control signal $D_{ctl}$ having a frequency determined by a frequency of a reference signal and a predetermined frequency setting code signal FCW. The digital control loop unit 3 can offset a shift of the phase of the voltage control oscillation signal, and generates the digital control signal $D_{ctl}$ having a phase opposite to a phase of the analog control signal $V_{MIX}$.

The analog control loop unit 2 controls a frequency of the voltage control oscillation signal to track the reception signal, whereas the digital control loop unit 3 blocks the control and controls the frequency of the voltage control oscillation signal to track the setting frequency determined by the reference signal and the frequency setting code signal. As a result of the performance of this type of reciprocal control, the analog control signal $V_{MIX}$ generated by the analog control loop unit 2 and the digital control signal $D_{ctl}$ generated by the digital control loop unit 3 become differential signals each having a mutually opposite phase.

The voltage controlled oscillator (VCO) 4 generates the voltage control oscillation signal (hereinafter, referred to as a VCO signal) based on the analog control signal $V_{MIX}$ and the digital control signal $D_{ctl}$.

The data slicer 5 compares the digital control signal $D_{ctl}$ to a predetermined threshold value in synchronization with the reference signal $CLK_{symbol}$ from a first reference signal source 20 and generates a digital signal in response to the reception signal. The digital signal is a signal including the reception signal demodulated digitally, and thus there is no need to provide an additional digital demodulator.

The analog control loop unit 2 includes a low noise amplifier 11, a frequency converter 12, and a low pass filter 13. The low noise amplifier 11 amplifies the reception signal from the antenna 6. The frequency converter 12 generates a phase difference signal between the reception signal and the VCO signal. The low pass filter 13 removes an unnecessary high frequency component included in an output signal of the frequency converter 12, and generates the analog control signal $V_{MIX}$.

The digital control loop unit 3 includes the first reference signal source 20, a time-to-digital converter (TDC) 21, a digital differentiator 22, a digital subtractor 23, an integrator 24, a loop gain control unit (a second loop gain control unit) 25, a loop filter 26, a channel selection filter 27, an automatic offset control unit 28, and a setting code adjuster 29.

The time-to-digital converter 21 detects the phase of the VCO signal in synchronization with a reference signal $F_{REF}$ from a second reference signal source 21.

The digital differentiator 22 performs differential processing to an output signal of the time-to-digital converter 21 so as to convert a signal indicating the phase of the VCO signal into a frequency signal.

The digital subtractor 23 detects a difference between an output signal of the digital differentiator 22 and the frequency setting code signal FCW so as to generate a frequency error signal.

The integrator 24 converts the frequency error signal generated by the digital subtractor 23, into a phase error signal. The phase error signal is input to the loop gain control unit 25.

The loop gain control unit 25 operates as a type II ADPLL, for example. Loop gain of the type II ADPLL attenuates with a second-order gradient toward the high frequency side. Therefore, the loop filter 26 is arranged at a subsequent stage of the loop gain control unit 25. The loop filter 26 removes a frequency component higher than the reception signal in the receiver 1 and performs smoothing so as to generate the digital control signal $D_{ctl}$.

The channel selection filter 27 is coupled to a subsequent stage of the loop filter 26, and suppresses a disturbing wave component included in the digital control signal $D_{ctl}$. The disturbing wave component to be suppressed is mainly a disturbing wave component in proximity to a channel selection frequency. The digital control signal $D_{ctl}$ that has passed through the channel selection filter 27 is input to the data slicer 5.

The digital control loop unit 3 includes an all digital (AD) PLL. Descriptions of an operation principle of the ADPLL will be omitted. The setting frequency $F_{VCO}$ in the digital control loop unit 3 is expressed by Expression (1) below:

$$F_{VCO} = FCW \times F_{ref} \quad (1)$$

where $F_{ref}$ represents the frequency of the reference signal.

The receiver 1 in FIG. 1 synchronizes the setting frequency $F_{VCO}$ expressed by Expression (1) with a carrier frequency of the reception signal so as to perform channel selection. However, for example, in a case where BPSK modulation has been performed to the reception signal, the phase shifts by $\pm n/2$ so that inconsistency occurs between the control operation of the analog control loop unit 2 that performs tracking with respect to the phase and the control operation of the digital control loop unit 3 that retains a phase constant. Thus, the receiver 1 in FIG. 1 sets loop gain of the digital control loop unit 3 sufficiently higher than loop gain of the analog control loop unit 2. Accordingly, the receiver 1 in FIG. 1 demodulates and digitally converts the PSK modulation signal, and additionally improves tolerance against a disturbing wave superimposed on the modulation signal.

When the reception signal to which the BPSK modulation has been performed (a BPSK signal) and the VCO signal are input to the frequency converter 12, the analog control loop unit 2 drives the analog control signal $V_{MIX}$ toward the plus side in a case where the phase of the VCO signal delays by n/2 in comparison to the phase of the reception signal, and drives the analog control signal $V_{MIX}$ toward the minus side in a case where the phase of the VCO signal advances by n/2, so as to cause the phase of the VCO signal to track the phase of the reception signal Data.

Meanwhile, the digital control loop unit 3 performs the operation for blocking the operation of the analog control loop unit 2. Furthermore, the digital control loop unit 3 has gain higher than the gain of the analog control loop unit 2 so that the digital control signal $D_{ctl}$ has a phase exactly opposite to the phase of the analog control signal $V_{MIX}$. As a result, the analog control signal $V_{MIX}$ and the digital control signal $D_{ctl}$ become the differential signals each having a mutually opposite (reverse) phase. The digital control signal $D_{ctl}$ is determined to be 1(+n/2) when operating toward the plus side, and the digital control signal $D_{ctl}$ is determined to be 0(−n/2) when operating toward the minus side, so that the BPSK signal can be demodulated.

The digital control signal $D_{ctl}$ is input to the voltage controlled oscillator 4 and the data slicer 5. The data slicer 5 is a digital comparator that operates with a reference clock that has synchronized with a symbol rate of the reception signal, and can correctly determine 1(+n/2) and 0(−n/2) of the digital control signal $D_{ctl}$ when a threshold value is set to be at an appropriate level.

The digital control signal $D_{ctl}$ is also input to the automatic offset control unit 28. The automatic offset control unit 28 generates a correction signal in response to an error between the frequency of the reception signal and the frequency of the VCO signal, based on a time difference between timing with which the digital control signal $D_{ctl}$ is equivalent to the threshold value of the data slicer 5 and previously determined reference timing. Here, the reference timing is previously determined timing in design, and is, more specifically, timing with which an eye pattern acquired from the digital control signal $D_{ctl}$ is a predetermined amount or more (for example, maximally opens).

The setting code adjuster 29 adjusts the frequency setting code signal based on the correction signal.

The receiver 1 according to the present embodiment originally has no concept of an in-phase signal and a quadrature signal, and can demodulate the reception signal to which the FSK/BPSK modulation has been performed, correcting a frequency offset between a transmitter and the receiver with only one of signal paths. This is because the digital control signal $D_{ctl}$ for the signal demodulation, includes information on the frequency and the phase.

Figure 2A:
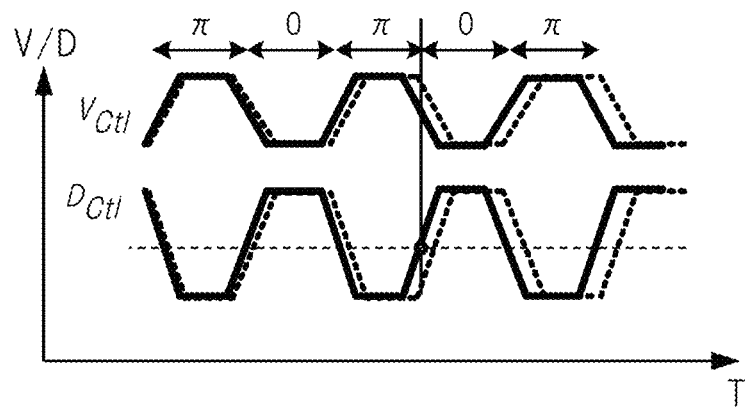
FIGS. 2A and 2B are signal waveform charts according to the first embodiment.
Figure 2B:
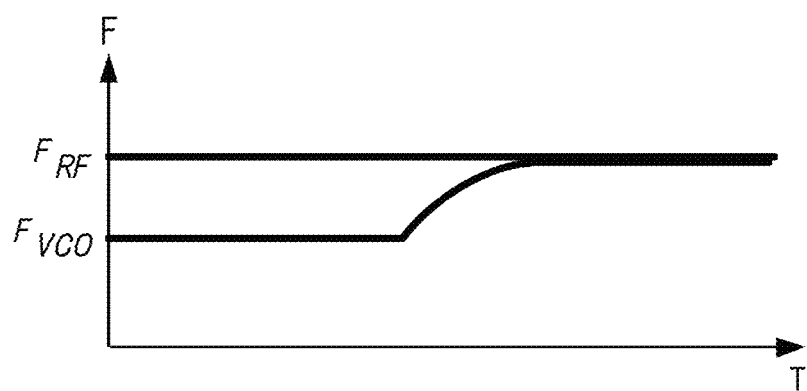

FIG. 2A is a signal waveform chart of the digital control signal $D_{ctl}$ and the analog control signal $V_{MIX}$ according to the first embodiment in a case where the frequency offset is present between the transmitter and the receiver that transmits and receives the BPSK signal, respectively, and in a case where the frequency offset is not present. FIG. 2B is a signal waveform chart of the setting frequency $F_{VCO}$ in the digital control loop unit 3.

A solid line waveform in FIG. 2A is an ideal signal waveform, and intersects the threshold value of the data slicer 5 at a substantially center point of amplitude of the digital control signal $D_{ctl}$. In a case where the BPSK modulation is performed, the digital control signal $D_{ctl}$ intersects the threshold value of the data slicer 5 at a boundary of a symbol and another symbol in terms of the reference timing.

However, when the frequency offset is present between the transmitter and the receiver, for example, the frequency shifts from the ideal signal waveform as a broken line waveform and the shift of the frequency gradually accumulates so as to be a phase error. That is, the frequency offset is present so that the phase error being an integrated value thereof increases.

Therefore, the automatic offset control unit 28 detects an increase of the phase error for each symbol, namely, a differential value of the digital control signal $D_{ctl}$ so as to regard the differential value as the correction signal. Then, the setting code adjuster 29 adds the correction signal to an input code signal for frequency setting, input to the receiver 1, so as to adjust the frequency setting code signal. The adjusted frequency setting code signal is input to the digital subtractor 23. Accordingly, the setting frequency $F_{VCO}$ of the digital control loop unit 3 gradually comes close to a desired frequency $F_{RF}$, as illustrated in FIG. 2B. Therefore, the frequency of the VCO signal of the voltage controlled oscillator 4 and the frequency of the reception signal can be synchronized.

In this manner, according to the first embodiment, the automatic offset control unit 28 is provided so as to generate the correction signal in response to the error between the frequency of the reception signal and the frequency of the VCO signal, based on the time difference between the timing with which the digital control signal $D_{ctl}$ is equivalent to the threshold value of the data slicer 5 and the reference timing. Thus, feedback control is performed to the digital control signal $D_{ctl}$ with the correction signal so that the frequency of the reception signal coincide with and the frequency of the VCO signal. Therefore, the frequency offset between the transmitter and the receiver can be canceled.

According to the present embodiment, the frequency offset can be corrected without a digital PLL circuit including an IQ demodulator and an angle arithmetic circuit so that a circuit scale can be reduced and power consumption can be also reduced.

Furthermore, the receiver 1 in FIG. 1 performs the digital conversion by using the time-to-digital converter 21 inside the digital control loop unit 3 so that an A/D converter that is originally required to be at a subsequent stage of the frequency converter 12 is not required and an internal configuration can be simplified.

The receiver 1 in FIG. 1 has tolerance significantly high against the disturbing wave in comparison to a conventional, analog synchronous FSK/PSK receiver 1. The higher the loop gain of the digital control loop unit 3 increases than the loop gain of the analog control loop unit 2, the more surely the oscillation frequency of the voltage controlled oscillator 4 can be prevented from being attracted into a disturbing frequency even when the disturbing wave having large power is present.

Furthermore, the loop gain of the digital control loop unit 3 is higher in the low frequency (the carrier frequency) side and is lower in the high frequency (the disturbing frequency) side so that an unnecessary component due to the disturbing wave can be suppressed by a gain difference therebetween.

The receiver 1 in FIG. 1 can generate the digital signal digitally demodulated by the data slicer 5 and no additional digital demodulator is required so that the internal configuration of the receiver 1 can be simplified.

Second Embodiment

A second embodiment to be described below includes an internal configuration of an automatic offset control unit 28 specified.

Figure 3:
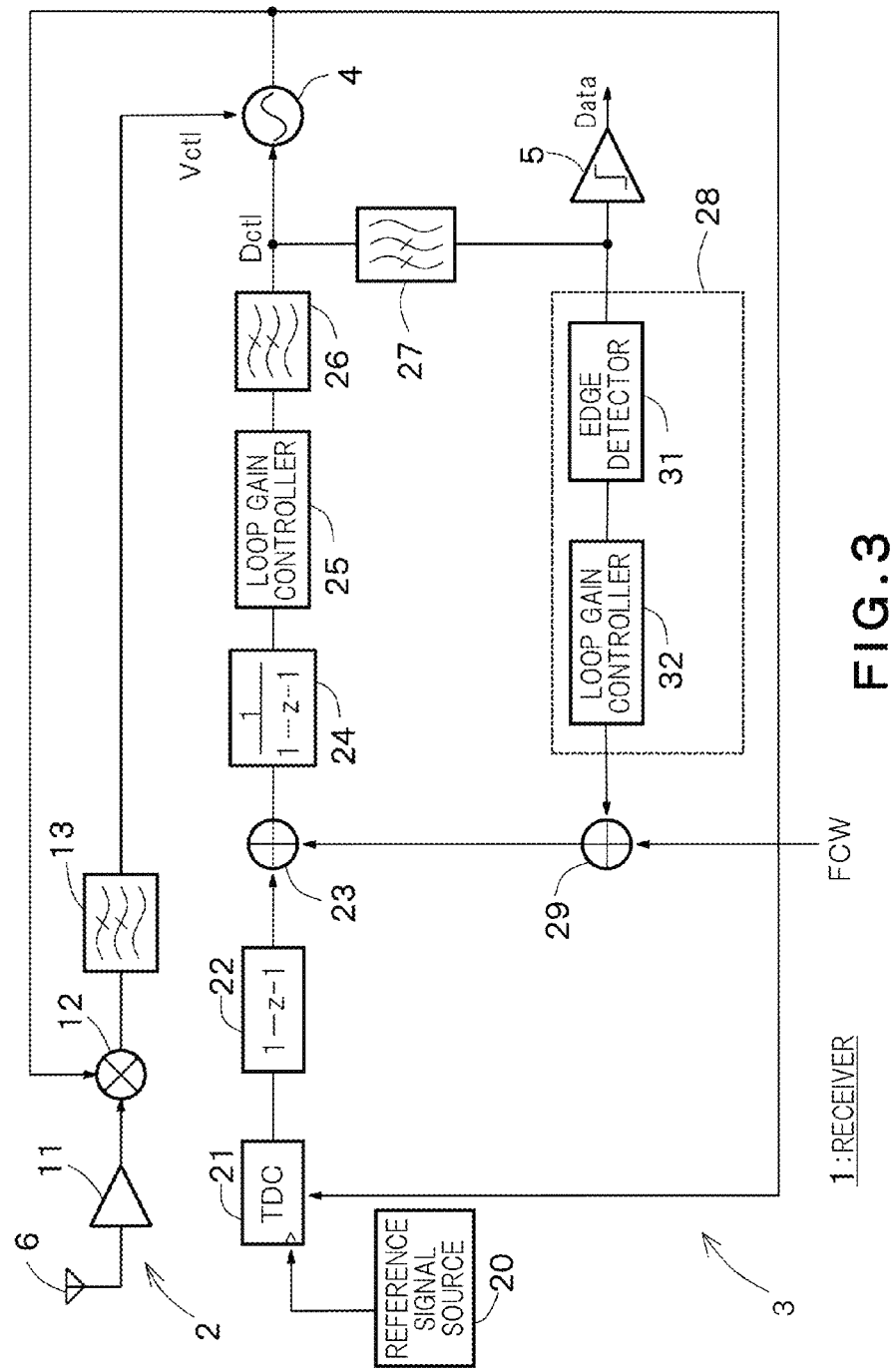
FIG. 3 is a block diagram of a schematic configuration of a receiver according to a second embodiment.

FIG. 3 is a block diagram of an internal configuration of a receiver 1 in a radio communication device according to the second embodiment. The receiver 1 in FIG. 3 is similar to that in FIG. 1 except the internal configuration of the automatic offset control unit 28 different from that in FIG. 1.

The automatic offset control unit 28 in FIG. 3 includes an edge detector 31 and a loop gain control unit (a first loop gain control unit) 32. The edge detector 31 detects the time difference between the timing with which the digital control signal $D_{ctl}$ is equivalent to the threshold value of the data slicer 5 and the reference timing, for each symbol, so as to output an error signal in response to the time difference. The loop gain control unit 32 generates a correction signal based on the error signal. More specifically, the loop gain control unit 32 multiplies the error signal by predetermined gain so as to generate the correction signal. The setting code adjuster 29 adds the correction signal to the input code signal for frequency setting so as to generate the frequency setting code signal.

In this manner, an automatic frequency correction loop includes the edge detector 31, the loop gain control unit 32, the setting code adjuster 29, the digital control loop unit 3, and the voltage controlled oscillator 4. The loop can be regarded as a frequency-locked loop (FLL). Even when the frequency offset between the transmitter and the receiver varies due to an external factor, the receiver 1 according to the present embodiment can correct the frequency offset, tracking the variation, by using the loop.

Figure 4A:
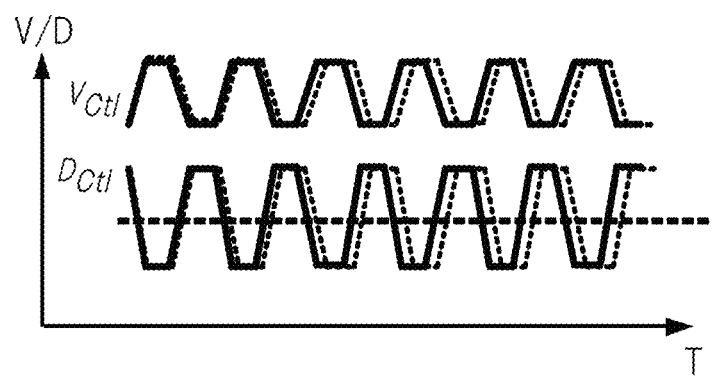
FIGS. 4A and 4B are signal waveform charts according to the second embodiment.
Figure 4B:

FIG. 4A is a signal waveform chart of the digital control signal $D_{ctl}$ and the analog control signal $V_{MIX}$ according to the second embodiment in a case where the frequency offset is present between the transmitter and the receiver that transmits and receives the BPSK signal, respectively, and in a case where the offset is not present. FIG. 4B is a signal waveform chart of the setting frequency $F_{VCO}$ in the digital control loop unit 3.

The edge detector 31 outputs the error signal for each symbol, and thus can adjust the frequency offset for each symbol. Therefore, as illustrated in FIG. 4A, the phase error that occurs due to the accumulation of the frequency offset, is smaller in comparison to that in FIG. 2A.

Note that, the edge detector 31 can detect the time difference described above by using any of a preamble section and a data section for each symbol.

Here, a loop band of the automatic offset control unit 28 is made lower than a loop band of the digital control loop unit 3. Accordingly, the frequency offset correction between the transmitter and the receiver by the automatic offset control unit 28 is gently performed so that the operation can be stabilized.

In this manner, according to the second embodiment, the automatic offset control unit 28 includes the edge detector 31 and the loop gain control unit 32 inside so that the correction signal can be generated for each symbol and the frequency offset adjustment can be performed for each symbol.

Third Embodiment

A third embodiment to be described below is to perform phase offset adjustment.

Figure 5:
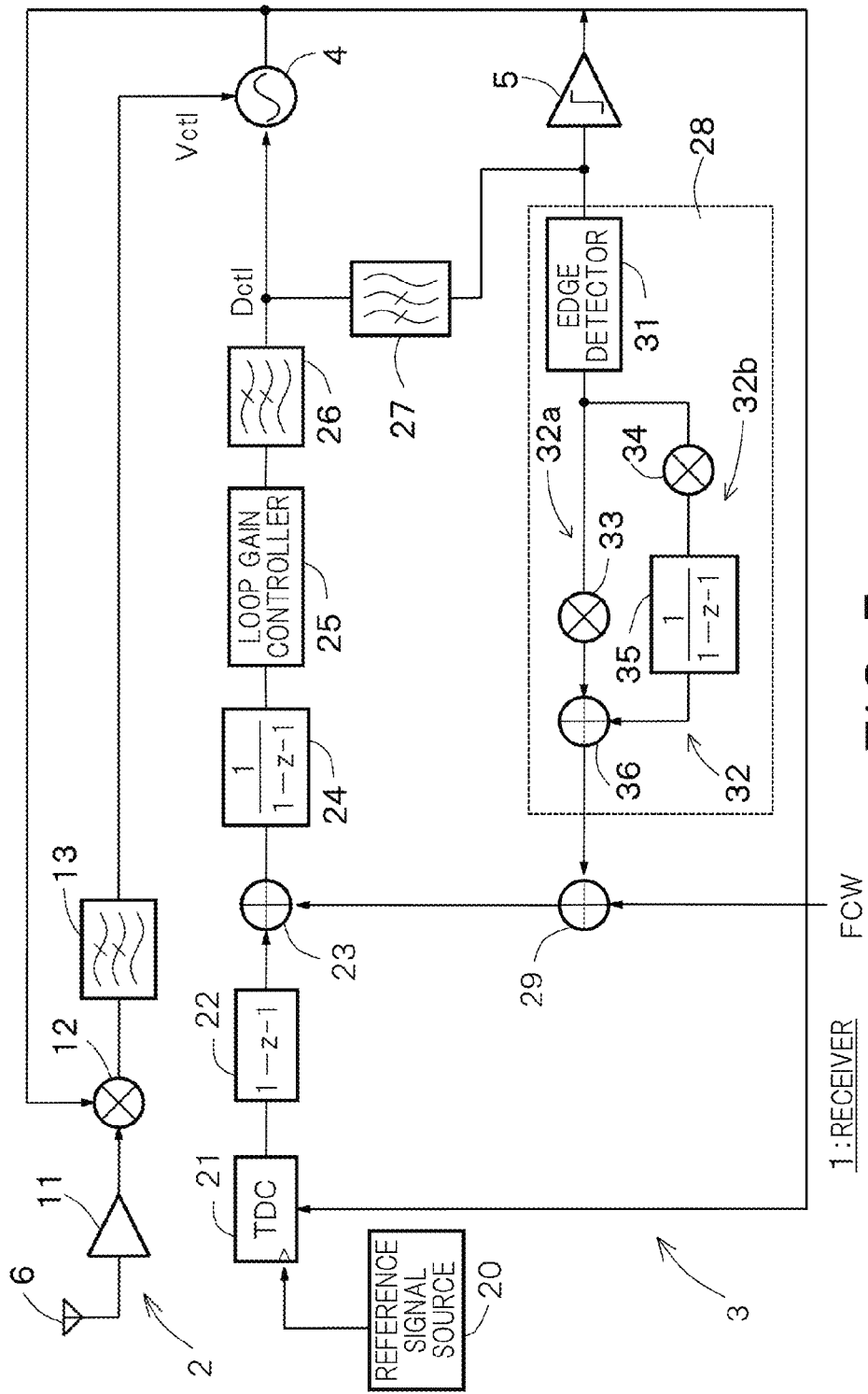
FIG. 5 is a block diagram of a schematic configuration of a receiver according to a third embodiment.

FIG. 5 is a block diagram of an internal configuration of a receiver 1 in a radio communication device according to the third embodiment. The receiver 1 in FIG. 5 is similar to that in FIG. 3 except an internal configuration of an automatic offset control unit 28 different from that in FIG. 3. In more detail, an internal configuration of a loop gain control unit 32 in the automatic offset control unit 28 in FIG. 5 is different from that in FIG. 3.

The edge detector 31 in the automatic offset control unit 28 in FIG. 5 detects the time difference between the timing with which the digital control signal $D_{ctl}$ intersects the threshold value of the data slicer 5 and the reference timing. The time difference can be regarded as the phase error between the transmitter and the receiver. The edge detector 31 detects the amount of the phase error and the polarity, generates a DN signal having a pulse width being the amount of the phase error in a case where the phase has advanced, and generates an UP signal having a pulse width being the amount of the phase error when the phase has delayed.

The loop gain control unit 32 in the automatic offset control unit 28 in FIG. 5 includes a proportion path unit 32a, an integral path unit 32b, and adder 36. The proportion path unit 32a includes a multiplier 33. The integral path unit 32b includes a multiplier 34 and an integrator 35. The adder 36 adds an output signal of the proportion path unit 32a and an output signal of the integral path unit 32b. The edge detector 31 supplies the DN signal and the UP signal to the multipliers 33 and 34.

The multiplier 33 in the proportion path unit 32a outputs a frequency offset amount based on the DN signal and the UP signal. The integrator 35 in the integral path unit 32b integrates a frequency offset amount acquired by the multiplier 34 so as to output a phase offset amount. The adder 36 adds an output signal of the multiplier 33 and an output signal of the integrator 35. An output signal of the adder 36 is a signal including both of the frequency offset amount and the phase offset amount. The setting code adjuster 29 adds the signal to the input code signal for frequency setting so that the frequency setting code signal is generated.

The digital control loop unit 3 adjusts the digital control signal $D_{ctl}$ with the frequency setting code signal so that the frequencies and the phases of the reception signal and the VCO signals can be individually synchronized.

Figure 6A:
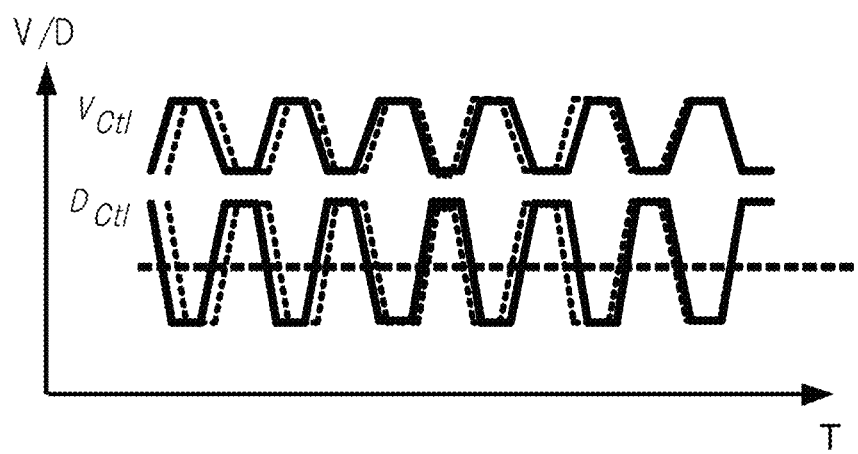
FIGS. 6A to 6C are signal waveform charts according to the third embodiment.
Figure 6B:
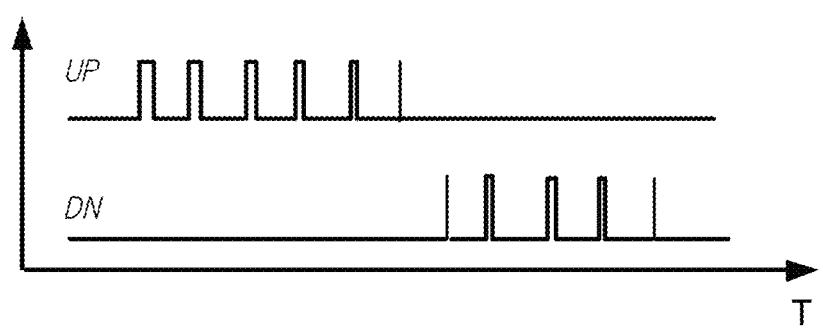
Figure 6C:
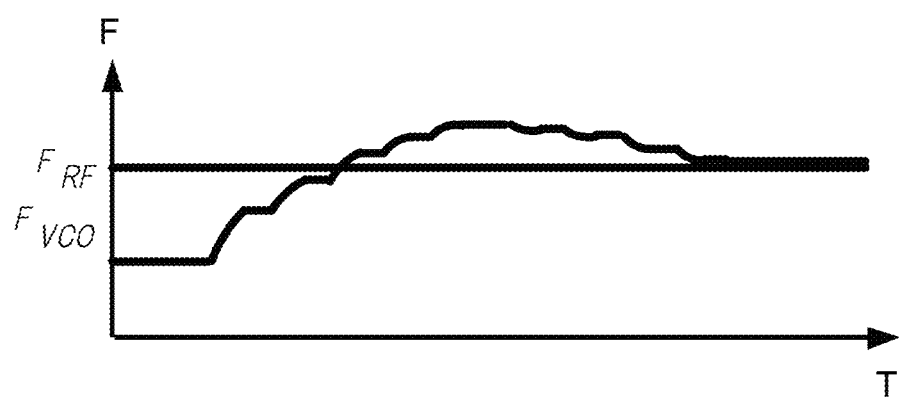

FIG. 6A is a signal waveform chart of the digital control signal $D_{ctl}$ and the analog control signal $V_{MIX}$ according to the third embodiment in a case where the frequency offset is present between the transmitter and the receiver that transmits and receives the BPSK signal, respectively, and in a case where the frequency offset is not present. FIG. 6B is a signal waveform chart of the UP signal and the DN signal. FIG. 6C is a signal waveform chart of the setting frequency $F_{VCO}$ in the digital control loop unit 3.

A solid line waveform indicates an actual signal waveform and a broken line waveform indicates an ideal signal waveform in FIG. 6A. Since the phase delays at the beginning in comparison to that of the ideal signal waveform, the UP signal is output so that the offset adjustment for the frequency and the phase is performed. After that, this time, the phase advances in comparison to that of the ideal signal waveform so that the DN signal is output. By performing this type of control individually, it is possible to synchronize the frequencies and the phases of the reception signal and the VCO signal.

In this manner, according to the third embodiment, the proportion path and the integral path are provided in the loop gain control unit 32 inside the automatic offset control unit 28 so that the frequency offset amount and the phase offset amount can be detected. Therefore, the frequency shift and the phase shift between the transmitter and the receiver can be corrected.

Fourth Embodiment

A fourth embodiment to be described later is to accelerate shift correction for the frequency and the phase between the transmitter and the receiver.

Figure 7:
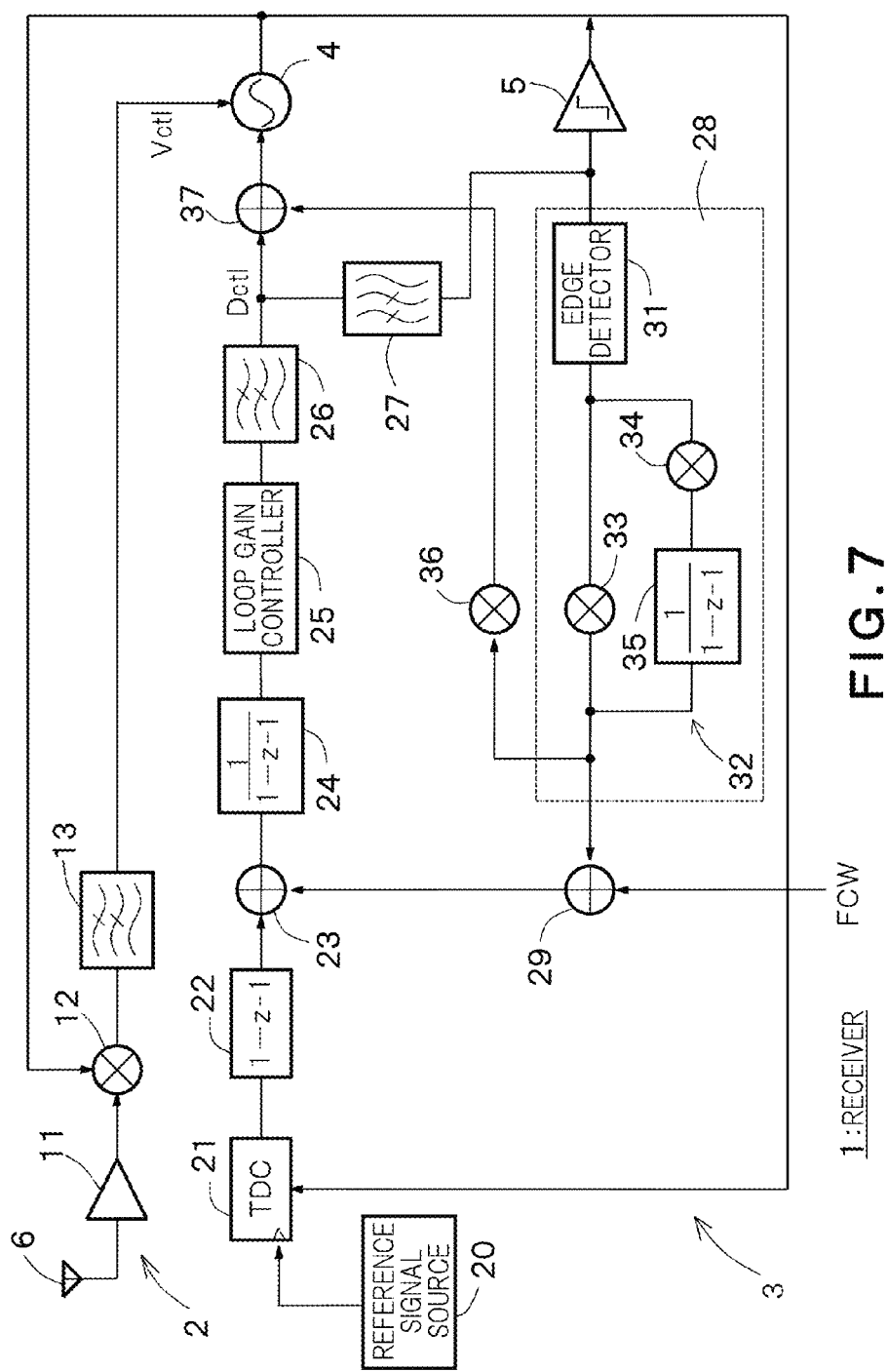
FIG. 7 is a block diagram of a schematic configuration of a receiver according to a fourth embodiment.

FIG. 7 is a block diagram of an internal configuration of a receiver 1 in a radio communication device according to the fourth embodiment. The receiver 1 in FIG. 7 includes the receiver 1 in FIG. 5 additionally added with a multiplier 36 and an adder 37. The multiplier 36 multiplies the correction signal output from the automatic offset control unit 28, by predetermined gain. The adder 37 supplies a signal including an output signal of the multiplier 36 and the digital control signal $D_{ctl}$ output from the loop gain control unit 25, added, to the voltage controlled oscillator 4. The multiplier 36 and the adder 37 correspond to an adjusting unit.

By providing the multiplier 36 and the adder 37, it is possible to promptly reflect the correction signal generated by the automatic offset control unit 28, in the digital control signal $D_{ctl}$ so that the control operation of the voltage controlled oscillator 4 can be accelerated.

Figure 8A:
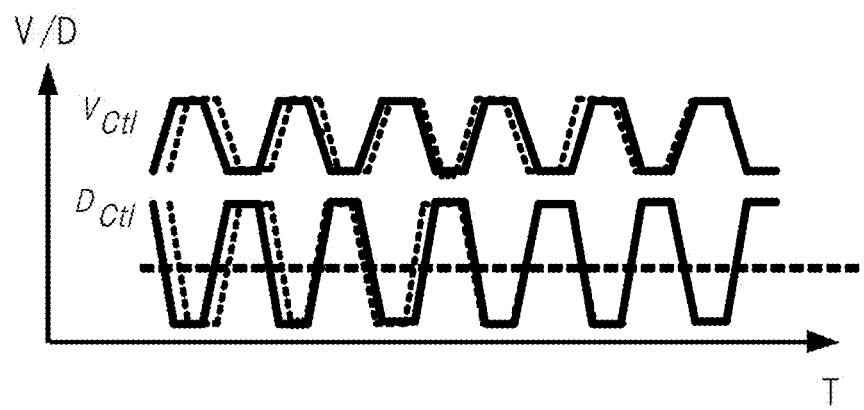
FIGS. 8A to 8C are signal waveform charts according to the fourth embodiment.
Figure 8B:
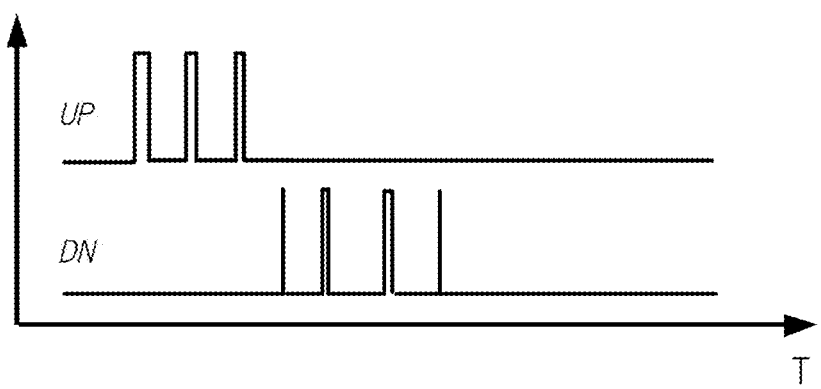
Figure 8C:
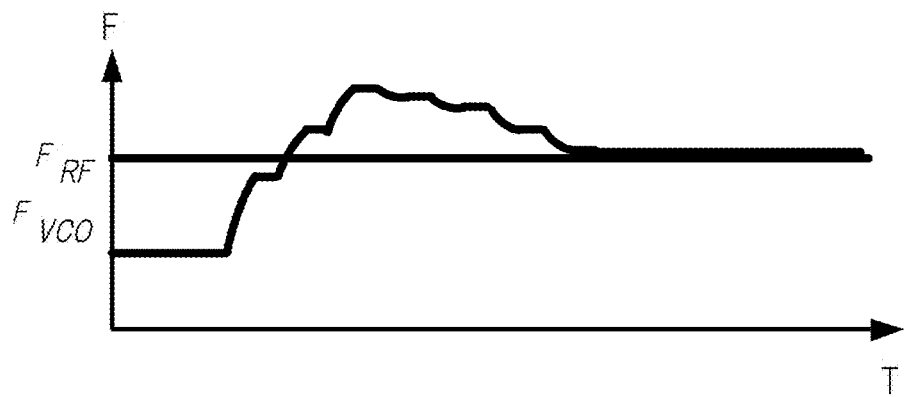

FIG. 8A is a signal waveform chart of the digital control signal $D_{ctl}$ and the analog control signal $V_{MIX}$ according to the fourth embodiment in a case where the frequency offset is present between the transmitter and the receiver that transmits and receives the BPSK signal, respectively, and in a case where the frequency offset is not present. FIG. 8B is a waveform chart of the UP signal and the DN signal. FIG. 8C is a signal waveform chart of the setting frequency $F_{VCO}$ in a digital control loop unit 3.

With comparison between FIGS. 8A to 8C and FIGS. 6A and 6C, according to the fourth embodiment, the frequency shift and the phase shift between the transmitter and the receiver can be corrected in a shorter time than that according to the third embodiment.

In this manner, according to the fourth embodiment, the correction signal output from the automatic offset control unit 28 can be promptly reflected in the digital control signal $D_{ctl}$ through the multiplier 36 and the adder 37, and the control operation of the voltage controlled oscillator 4 can be accelerated so that the frequency shift and the phase shift between the transmitter and the receiver can be more promptly corrected.

Fifth Embodiment

The configuration and operation of the receiver 1 have been described in each of the first to fourth embodiments described above. In a fifth embodiment to be described below, an exemplary hardware configuration of a radio communication device including any of the configurations of the receivers 1 according to the first to fourth embodiments and additionally including a transmitter, will be described below. A receiver 1 in the radio communication device according to the fifth embodiment, includes any of the first to fourth embodiments described above, and thus the detailed descriptions thereof will be omitted.

Figure 9:
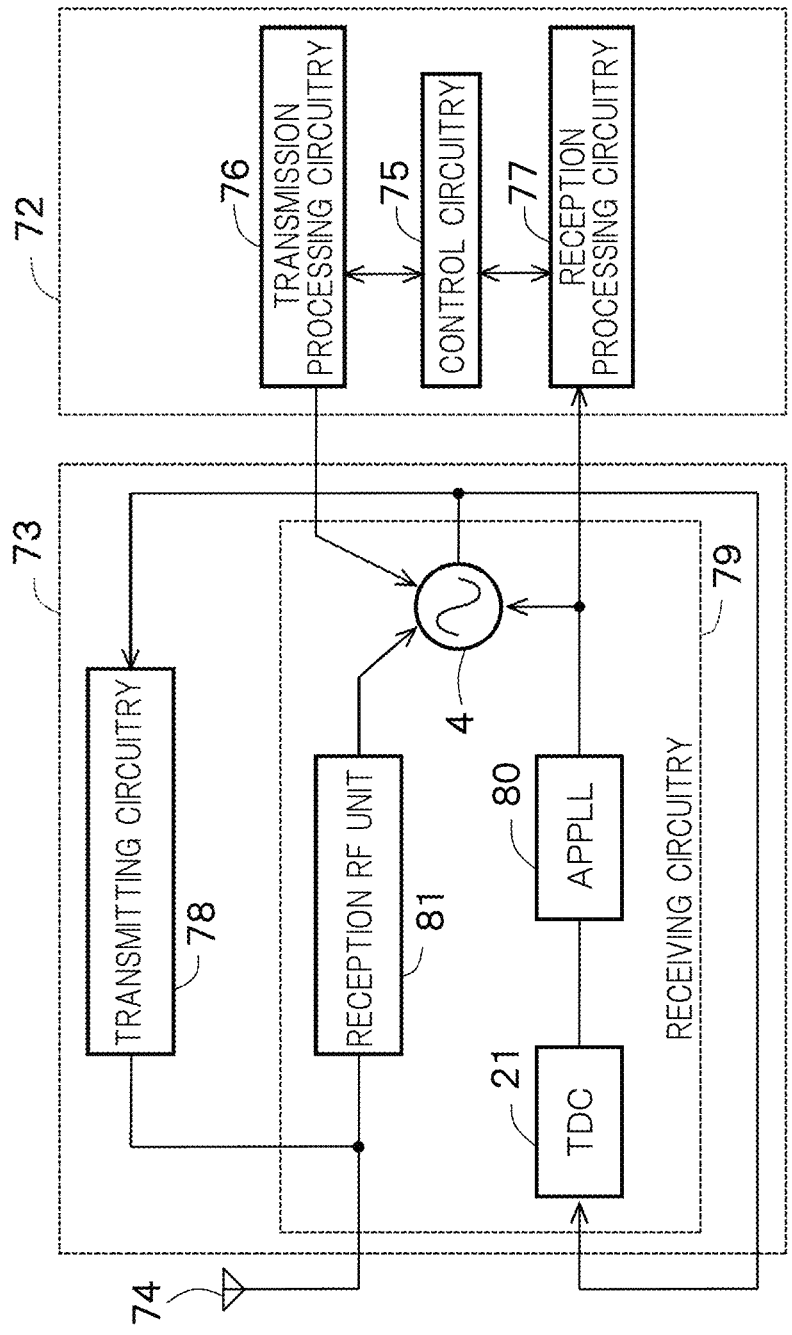
FIG. 9 is a block diagram of a schematic configuration of a radio communication device according to a fifth embodiment.

FIG. 9 is a block diagram of a schematic configuration of the radio communication device 71 according to the fifth embodiment. The radio communication device 71 in FIG. 9 includes a baseband unit 72, an RF unit 73, and an antenna unit 74.

The baseband unit 72 includes a control circuit 75, a transmission processing circuit 76, and a reception processing circuit 77. Each of the circuits inside the baseband unit 72 performs digital signal processing.

The control circuit 75 performs, for example, processing of a media access control (MAC) layer. The control circuit 75 may perform processing of a host network hierarchy of the MAC layer. The control circuit 75 may perform processing relating to multi-input multi-output (MIMO). For example, the control circuit 75 may perform, for example, propagation path estimation processing, transmission weight calculation processing, and stream separation processing.

The transmission processing circuit 76 generates a digital transmission signal. The reception processing circuit 77 performs processing of analyzing a preamble and a physical header, for example, after performing demodulation and decoding.

The RF unit 73 includes a transmitting circuit 78 and a receiving circuit 79. The transmitting circuit 78 includes a transmission filter not illustrated that extracts a signal in a transmission band, a mixer not illustrated that upconverts the signal that has passed through the transmission filter, into a radio communication frequency by using the oscillation signal of the VCO 4, and a preamplifier not illustrated that amplifies the signal that has been upconverted. The receiving circuit 79 has a configuration similar to that of the receiver 1 according to any of the first to the fourth embodiment described above. That is, the receiving circuit 79 includes the TDC 21, an ADPLL unit 80, a reception RF unit 81, and the VCO 4.

The ADPLL unit 80 includes, for example, the digital differentiator 22, the digital subtractor 23, the integrator 24, the loop gain control unit 25, the loop filter 26, the channel selection filter 27, the automatic offset control unit 28, and the setting code adjuster 29 in FIG. 1. The reception RF unit 81 includes, for example, the low noise amplifier 11, the frequency converter 12, and the low pass filter 13 in FIG. 1. The VCO 4 is shared by the transmitting circuit 78 and the receiving circuit 79 in the RF unit 73 in FIG. 9, but a separate VCO may be provided for each circuit.

In a case where transmission and reception of a radio communication signal are performed through the antenna unit 74, a switch that couples any one of the transmitting circuit 78 and the receiving circuit 79, to the antenna unit 74, may be provided in the RF unit 73. When this type of switch is provided, the antenna unit 74 can be coupled to the transmitting circuit 78 during the transmission, and the antenna unit 74 can be coupled to the receiving circuit 79 during the reception.

The transmission processing circuit 76 in FIG. 9 outputs only one-channel transmission signal, but may separately output an I signal and a Q signal, depending on a radio communication system. A block configuration of a radio communication device 71 in this case is, for example, illustrated in FIG. 10. The radio communication device 71 in FIG. 10 is different from that in FIG. 9 in a configuration between the transmission processing circuit 76 and the transmitting circuit 78.

The transmission processing circuit 76 generates a double-channel digital baseband signal (hereinafter, referred to as a digital I signal and a digital Q signal).

A DA conversion circuit 82 that converts the digital I signal into an analog I signal, and a DA conversion circuit 83 that converts the digital Q signal into an analog Q signal, are provided between the transmission processing circuit 76 and the transmitting circuit 78. The transmitting circuit 78 upconverts the analog I signal and the analog Q signal by using a mixer not illustrated.

Figure 10:
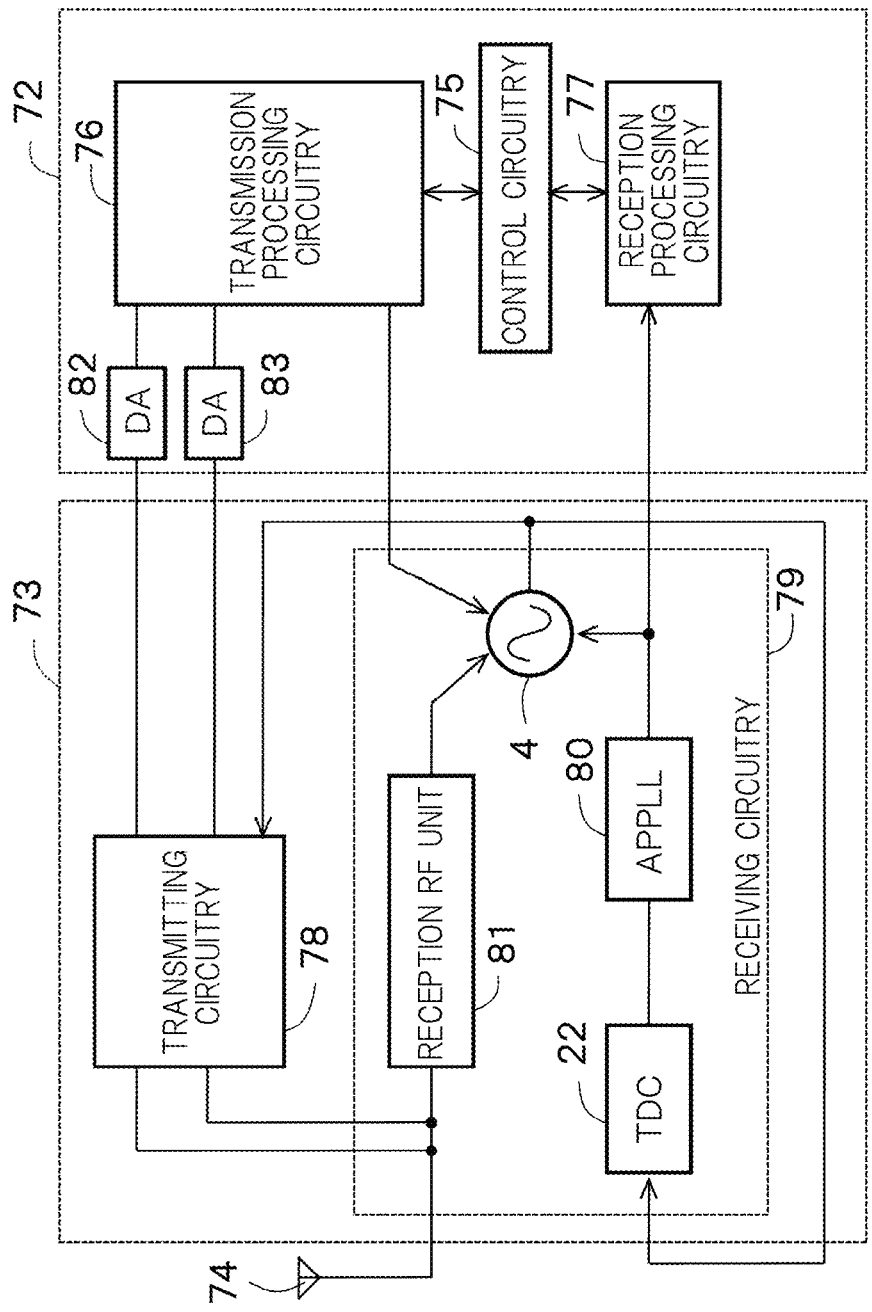
FIG. 10 is a block diagram of one modification of FIG. 9.

The RF unit 73 and the baseband unit 72 illustrated in each of FIGS. 9 and 10 may be made on one chip, or the RF unit 73 and the baseband unit 72 may be individually made on a separate chip. The RF unit 73 and the baseband unit 72 may partially include a discrete component, and the remaining may include one or a plurality of chips.

Furthermore, the RF unit 73 and the baseband unit 72 may include a software radio configurable with software. In this case, a digital signal processing processor is used so that functions of the RF unit 73 and the baseband unit 72 are at least achieved with the software. In this case, a bus, the processor, and an external interface unit are provided inside the radio communication device 71 illustrated in each of FIGS. 9 and 10. The processor and the external interface unit are coupled through the bus, and firmware operates in the processor. The firmware can be updated with a computer program. The processor operates the firmware so that processing operation of the RF unit 73 and the baseband unit 72 illustrated in each of FIGS. 9 and 10 can be performed.

The radio communication devices 71 in FIGS. 9 and 10 include only the single antenna unit 74, but the number of the antennas is not particularly limited. For example, a transmission antenna unit 74 and a reception antenna unit 74 may be separately provided or an I signal antenna unit 74 and a Q signal antenna unit 74 may be separately provided. When only one antenna unit 74 is provided, a transmission-and-reception changeover switch at least switches the transmission and the reception.

The radio communication devices 71 illustrated in FIGS. 9 and 10 can be applied to a stationary radio communication device 71, such as an access point, a wireless router, or a computer, can be applied to a portable radio terminal, such as a smartphone or a mobile phone, can be applied to peripheral equipment, such as a mouse or a keyboard, that performs radio communication with a host device, can be applied to a card-typed member including a radio function built therein, or can be applied to a wearable terminal that performs radio communication of biological information. A radio system of the radio communication between the radio communication devices 71 illustrated in FIG. 9 or 10 are not particularly limited. The radio system is applicable to third generation or later cellular communication, a wireless LAN, Bluetooth (registered trademark), and near-field radio communication.

Figure 11:
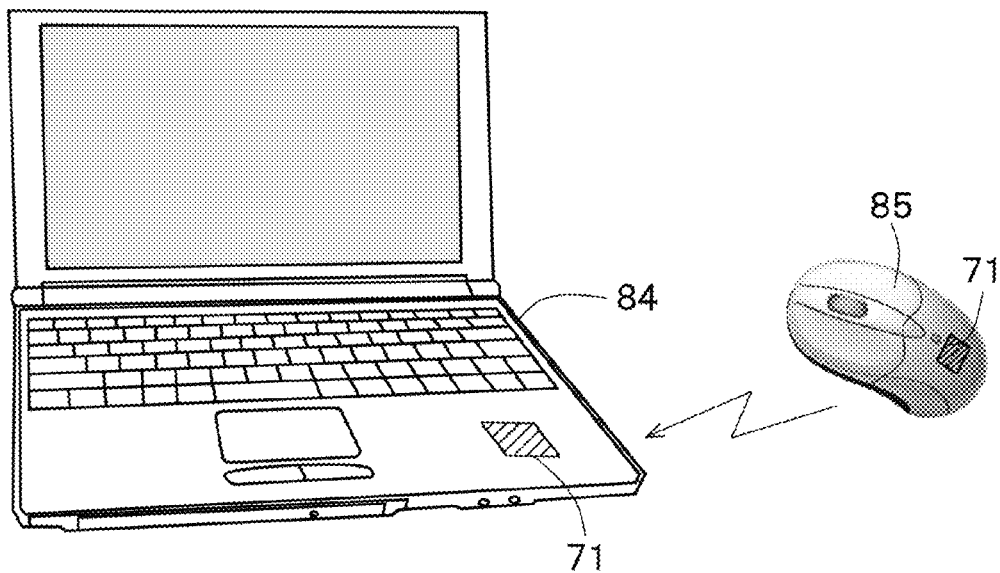
FIG. 11 is a view of exemplary radio communication between a PC and a mouse.

FIG. 11 illustrates exemplary performance of radio communication between a PC 84 being a host device and a mouse 85 being peripheral equipment. Both of the PC 84 and the mouse 85 include the radio communication device 71 illustrated in FIG. 9 or 10 built therein. The mouse 85 uses power of a built-in battery so as to perform the radio communication, and is required to perform the radio communication with power consumption as low as possible because a space in which the battery is built is limited. Accordingly, it is preferable to perform the radio communication by using a radio system capable of low consumption radio communication, such as Bluetooth Low Energy defined in a standard of Bluetooth (registered trademark) 4.0.

Figure 12:
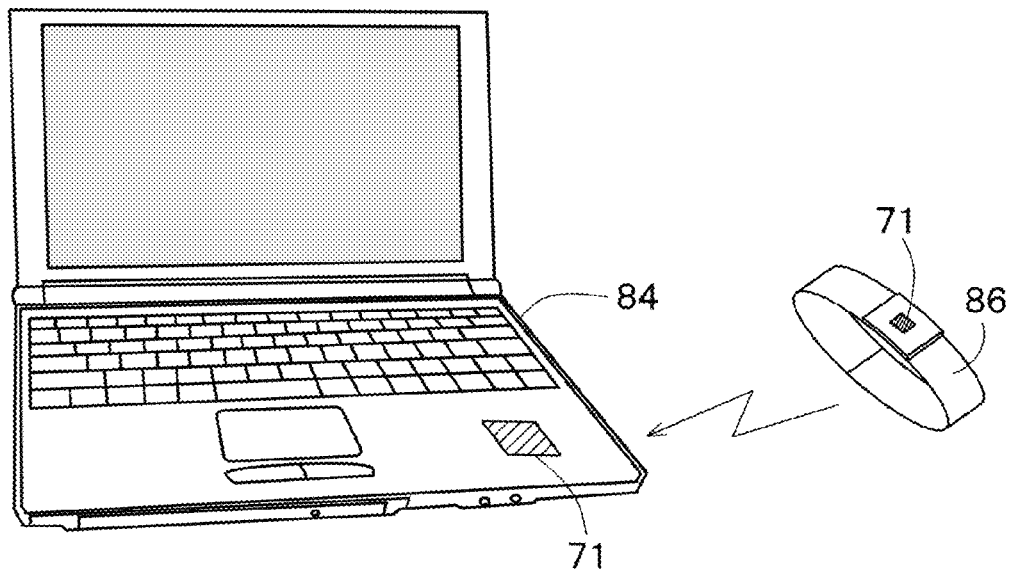
FIG. 12 is a view of exemplary radio communication between the PC and a wearable terminal.

FIG. 12 illustrates exemplary performance of radio communication between a wearable terminal 86 and a host device (for example, the PC 84). The wearable terminal 86 is to be worn on a body of a person, and various examples thereof may include a seal type to be worn on a body, an eyeglasses type and an earphone type to be worn on a body except arms, and a pacemaker to be inserted inside a body, in addition to a type to be worn on an arm illustrated in FIG. 12. Both of the wearable terminal 86 and the PC 84 in FIG. 12 also include the radio communication device 71 illustrated in FIG. 9 or 10 built therein. Note that, examples of the PC 84 include a computer and a server. The above radio system capable of the radio communication with low power consumption, such as Bluetooth Low Energy, is also preferably adopted because the wearable terminal 86 is worn on a body of a person and a space for a built-in battery is limited.

When the radio communication is performed between the radio communication devices 71 illustrated in FIG. 9 or 10, the type of information to be transmitted and received through the radio communication is not limited. Note that, the radio system is preferably varied between a case where information including a large amount of data, such as moving image data, is transmitted and received and a case where information including a small amount of data, such as operation information of the mouse 85, is transmitted and received. Thus, there is a need to perform the radio communication in an optimum radio system in accordance with the amount of information to be transmitted and received.

Furthermore, when the radio communication is performed between the radio communication devices 71 illustrated in FIG. 9 or 10, a notifying unit that notifies a user of an operation state of the radio communication, may be provided. Specific examples of the notifying unit may include display of the operation state on a display device including LEDs, notification of the operation state by vibration of a vibrator, and notification of the operation state from audio information by a speaker or a buzzer.

The receivers 1 described in the embodiments described above, may at least partially include hardware or include software. When the configuration including the software is provided, a program for achieving a function of the at least partial receivers 1 may be stored in a storage medium, such as a flexible disk or a CD-ROM, and then may be read and performed by a computer. The storage medium is not limited to a detachably attachable storage medium, such as a magnetic disk or an optical disc, and may be a non-removable storage medium, such as a hard disk or a memory.

The program for achieving the function of the at least partial receivers 1, may be distributed through a communication line, such as the Internet, (including radio communication). Furthermore, the program that has been encrypted, modulated, or compressed, may be distributed through a wired line or a wireless line, such as the Internet, or may be stored in a storage medium and then may be distributed.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A radio communication device comprising:
   an analog control loop unit to generate an analog control signal that adjusts a phase of a voltage control oscillation signal, in synchronization with a phase of a reception signal;
   a digital control loop unit to generate a digital control signal having a frequency determined by a frequency of a reference signal and a predetermined frequency setting code signal and a phase opposite to a phase of the analog control signal;
   a voltage controlled oscillator to generate the voltage control oscillation signal, based on the analog control signal and the digital control signal;
   a data slicer to generate a digital signal including the reception signal digitally demodulated, based on a comparison between the digital control signal and a threshold value;
   an automatic offset controller to generate a correction signal in response to an error between a frequency of the reception signal and a frequency of the voltage control oscillation signal, based on a time difference between timing with which the digital control signal is equivalent to the threshold value and previously determined reference timing; and
   a setting code adjuster to adjust the frequency setting code signal based on the correction signal,
   wherein gain of the digital control loop unit is higher than gain of the analog control loop unit.

2. The radio communication device according to claim 1, wherein the setting code adjuster adds an input code signal for frequency setting, input to the radio communication device, and the correction signal so as to generate the frequency setting code signal.

3. The radio communication device according to claim 1, wherein the automatic offset controller comprises:
   an edge detector to detect the time difference between the timing with which the digital control signal is equivalent to the threshold value of the data slicer and the reference timing, for each symbol, so as to output an error signal in response to the time difference; and
   a first loop gain controller to generate the correction signal based on the error signal,
   wherein a loop band of the automatic offset controller is lower than a loop band of the digital control loop unit.

4. The radio communication device according to claim 3, wherein the error signal output by the edge detector includes polarity and a phase error amount of the time difference, and
   the first loop gain controller comprises:
   a proportion path unit to multiply the error signal by predetermined gain so as to generate a first correction signal in response to a frequency offset;
   an integral path unit to integrate a value including the error signal multiplied by the predetermined gain, by a time base so as to generate a second correction signal in response to a phase offset; and
   an adder to add the first correction signal and the second correction signal so as to generate the correction signal.

5. The radio communication device according to claim 1, wherein the analog control loop unit comprises:

a frequency converter to generate a phase difference signal between the reception signal and the voltage control oscillation signal; and a low pass filter to perform band limiting to an output signal of the frequency converter so as to generate the analog control signal, and the digital control loop unit comprises:

a time-to-digital converter to detect the phase of the voltage control oscillation signal in synchronization with the reference signal;

a digital differentiator to perform differential processing to an output signal of the time-to-digital converter so as to convert the output signal into frequency information;

a digital subtractor to detect a difference between an output signal of the digital differentiator and the frequency setting code signal so as to generate a frequency error signal; and a second loop gain controller to generate the digital control signal based on an output signal of the digital subtractor.

6. The radio communication device according to claim 5, further comprising:

an adjusting unit to adjust the digital control signal generated by the second loop gain controller, based on the correction signal, wherein the voltage controlled oscillator generates the voltage control oscillation signal based on the digital control signal that has been adjusted by the adjusting unit and the analog control signal.

7. The radio communication device according to claim 1, wherein the reception signal comprises, for each symbol:

a preamble section including a carrier wave signal that has not been modulated; and a modulated section including data modulated to the carrier wave signal, and the automatic offset controller corrects the frequency setting code signal, for each symbol, based on any of the preamble section and the modulated section in the reception signal.

8. The radio communication device according to claim 1, wherein the reference timing is timing with which an eye pattern acquired from the digital control signal opens by a predetermined amount or more.

9. The radio communication device according to claim 1, further comprising:

integrated circuitry that comprises the analog control loop unit, the digital control loop unit, the voltage controlled oscillator, the data slicer, the automatic offset controller, and the setting code adjuster.

10. The radio communication device according to claim 1, further comprising:

at least one antenna.

11. A radio communication device comprising:

an RF unit that comprises transmitting circuitry and receiving circuitry; and a baseband unit that comprises transmission processing circuitry and reception processing circuitry, wherein the receiving circuitry includes:

an analog control loop unit to generate an analog control signal for adjusting a phase of a voltage control oscillation signal, in synchronization with a phase of a reception signal;

a digital control loop unit to generate a digital control signal having a frequency determined by a frequency of a reference signal and a predetermined frequency setting code signal and a phase opposite to a phase of the analog control signal;

a voltage controlled oscillator to generate the voltage control oscillation signal, based on the analog control signal and the digital control signal;

an automatic offset controller to generate a correction signal in response to an error between a frequency of the reception signal and a frequency of the voltage control oscillation signal; and a setting code adjuster to adjust the frequency setting code signal based on the correction signal, the reception processing circuitry includes a data slicer to generate a digital signal including the reception signal digitally demodulated, based on a result of comparison between the digital control signal and a predetermined threshold value, the automatic offset controller generates the correction signal in response to the error between the frequency of the reception signal and the frequency of the voltage control oscillation signal, based on a time difference between timing with which the digital control signal is equivalent to the threshold value of the data slicer and previously determined reference timing, and gain of the digital control loop unit is higher than gain of the analog control loop unit.

12. A radio communication method comprising:

generating an analog control signal that adjusts a phase of a voltage control oscillation signal, by using an analog control loop, in synchronization with a phase of a reception signal;

generating a digital control signal having a frequency determined by a frequency of a reference signal and a predetermined frequency setting code signal and a phase opposite to a phase of the analog control signal, by using a digital control loop;

generating the voltage control oscillation signal based on the analog control signal and the digital control signal;

generating a digital signal including the reception signal digitally demodulated, based on a result of comparison between the digital control signal and a predetermined threshold value;

generating a correction signal by automatic offset control in response to an error between a frequency of the reception signal and a frequency of the voltage control oscillation signal, based on a time difference between timing with which the digital control signal is equivalent to the threshold value and previously determined reference timing; and adjusting the frequency setting code signal based on the correction signal, wherein gain of the digital control loop is higher than gain of the analog control loop.

13. The radio communication method according to claim 12, wherein an input code signal for frequency setting, input to the radio communication device, and the correction signal are added to generate the frequency setting code signal.

14. The radio communication method according to claim 12, wherein the automatic offset control comprises:

the time difference between the timing with which the digital control signal is equivalent to the threshold value of the data slicer and the reference timing is detected for each symbol, so as to output an error signal in response to the time difference; and the correction signal is generated by a first loop gain control based on the error signal, a loop band of the automatic offset control is lower than a loop band of the digital control loop.

15. The radio communication method according to claim 14,
wherein the error signal includes polarity and a phase error amount of the time difference, and
the first loop gain control comprises:
multiplying the error signal by predetermined gain so as to generate a first correction signal in response to a frequency offset;
integrating a value including the error signal multiplied by the predetermined gain, by a time base so as to generate a second correction signal in response to a phase offset; and
adding the first correction signal and the second correction signal so as to generate the correction signal.

16. The radio communication method according to claim 12,
wherein the analog control loop comprises:
generating a phase difference signal between the reception signal and the voltage control oscillation signal; and
limiting a frequency band of the phase difference signal so as to generate the analog control signal, and
the digital control loop comprises:
detecting the phase of the voltage control oscillation signal in synchronization with the reference signal to output a phase detecting signal;
performing differential processing to the phase detecting signal so as to convert the output signal into frequency information;
detecting a difference between a signal after the differential processing and the frequency setting code signal so as to generate a frequency error signal; and
generating the digital control signal based on the frequency error signal.

17. The radio communication method according to claim 16, further comprising:
adjusting the digital control signal based on the correction signal,
wherein the voltage controlled oscillation signal is generated based on the digital control signal after adjustment and the analog control signal.

18. The radio communication method according to claim 12,
wherein the reception signal comprises, for each symbol:
a preamble section including a carrier wave signal that has not been modulated; and
a modulated section including data modulated to the carrier wave signal, and
the automatic offset control corrects the frequency setting code signal, for each symbol, based on any of the preamble section and the modulated section in the reception signal.

19. The radio communication method according to claim 12,
wherein the reference timing is timing with which an eye pattern acquired from the digital control signal opens by a predetermined amount or more.

* * * * *

UNITED STATES PATENT AND TRADEMARK OFFICE
CERTIFICATE OF CORRECTION

PATENT NO. : 9,735,790 B2  
APPLICATION NO. : 15/438030  
DATED : August 15, 2017  
INVENTOR(S) : Akihide Sai et al.

Page 1 of 1

It is certified that error appears in the above-identified patent and that said Letters Patent is hereby corrected as shown below:

On the Title Page

Item (63), the Related U.S. Application Data information is incorrect. Item (63) should read:
--Related U.S. Application Data
(63) Continuation of application No. PCT/JP2015/072849, filed on Aug. 12, 2015--

Signed and Sealed this
First Day of May, 2018

Andrei Iancu
*Director of the United States Patent and Trademark Office*